United States Patent [19]
Lee et al.

[11] Patent Number: 6,080,666
[45] Date of Patent: Jun. 27, 2000

[54] METHOD FOR INCREASING LANDING PAD AREA

[75] Inventors: Hal Lee, Taipei; Der-Yuan Wu, Hsin-Chu, both of Taiwan

[73] Assignee: United Microelectronics Corp., Hsin-Chu, Taiwan

[21] Appl. No.: 09/274,596

[22] Filed: Mar. 23, 1999

[51] Int. Cl.[7] .................... H01L 21/44; H01L 21/4763
[52] U.S. Cl. ............ 438/657; 438/672; 438/675; 438/647; 438/637
[58] Field of Search .................. 438/637, 629, 438/639, 672, 675, 638, 612, 652, 667, 735, 739, 674, 622, 108, 647, 657, 624

[56] References Cited

U.S. PATENT DOCUMENTS

| | | | |
|---|---|---|---|
| 5,279,989 | 1/1994 | Kim | 438/672 |
| 5,527,738 | 6/1996 | Koh et al. | 438/654 |
| 5,854,127 | 12/1998 | Pan | 438/629 |
| 5,909,636 | 6/1999 | Nguyen et al. | 438/647 |
| 5,914,518 | 6/1999 | Nguyen et al. | 257/377 |

*Primary Examiner*—Charles Bowers
*Assistant Examiner*—Hsien-Ming Lee
*Attorney, Agent, or Firm*—Harness, Dickey & Pierce, P.L.C.

[57] ABSTRACT

A method for increasing landing pad area is disclosed. Firstly, providing a fundamental structure, wherein shallow trench isolation (STI) is used and acting as an electrical isolation inside of substrate. Moreover, there are at least two gates with an isolation layer on top of the substrate and covered with a dielectric layer. Between the neighboring gates there is a contact hole that penetrates the dielectric layer from the top of the dielectric layer to the substrate. Taking this fundamental structure as the starting point for forming a conductor within the contact hole. Etching back the dielectric layer and exposing its top surface and a portion of sidewalls. Finally, a protection layer on top of the exposed portion of sidewalls of the conductor is formed in order to expand the landing pad area. After all, one would still be able to increase the landing pad area even though the distance between two gates is rather small. This method can solve all the puzzles caused by alignment accuray shift during post-process.

10 Claims, 3 Drawing Sheets

METHOD FOR INCREASING LANDING PAD AREA

BACKGROUND OF THE INVENTION

1. Field of the Invention

The present invention relates to a making of landing pad, and more particularly a method for increasing the area of landing pad.

2. Description of the Prior Art

Owing to the gradual concentration of integrated circuits, there is a trend of reducing the size of semiconductor device and the distance between devices with each passing day. Therefore, more advanced processing technology and better device structures are highly demanded, urgently.

Taking the production of dynamic random access memory (DRAM) as an example, it is also progressing toward the trend of shrinkage. That is, the gate width used for the word line has become smaller and smaller and there is also a trend in the reduction of every device size and the distance between devices. Under this particular situation, an alignment accuracy shift from the mask would often result in a very serious harm toward the processing field. The so-called alignment accuracy shift is simply an error between the etching point defined by the mask pattern and the actual contact point reserved on the substrate. This results in a shift of the hole formed after etching away from the predicted location. This shift is very likely to end up with unrecoverable consequences.

Take the formation of a capacitor as a further example. Fundamental transistors are formed on top of a substrate, moreover, a landing pad is located between the neighboring gates and a dielectric layer is positioned on top. The process follows in making a contact between capacitor and landing pad for defining the location of a contact window. Furthermore, a contact hole is etched all the way to the landing pad. At the same time when semiconductor devices are becoming smaller, the distance between two gates would be shorter as well and this will cause the area of the landing pad between two gates to become smaller. Herein, the alignment accuracy shift produced after the contact hole is etched would likely make the contact hole to be etched all the way to the gate. According to FIG. 1, when this contact hole is filled with conductor and also forms a capacitor, it is very likely to cause conductivity between the gate and the capacitor. Short circuit phenomena between word line and bit line occurs straight away.

In the situation where current masking and photolithography technology still cannot overcome the problem mentioned above totally, changes must be made toward the process in order to reduce short circuit probability. Therefore, a new method for forming landing pad needs to be developed. The method should not only overcome the problem carried by alignment accuracy shift. It also needs to adapt the principle of semiconductor device shrinkage in order to follow the trend of future development.

SUMMARY OF THE INVENTION

In accordance with the present invention, a method is provided for forming the landing pad that substantially solves all the drawbacks caused by the traditional landing pad formation mentioned in the background of the invention. The principle of spacer formation is used here to expand the landing pad area without any increment in device size and distance between devices. This method adapts the trend of reducing the size of the semiconductor fully and also can solve all the puzzles caused by alignment accuracy shift.

In one embodiment of the present invention, firstly providing a fundamental structure with the following components: substrate, shallow trench isolation, gates with isolation layer, interpoly dielectric (IPD), and contact hole. The main body of the landing pad would be the contact hole with doped-polysilicon (D-pl) deposition. Etching back IPD in order to expose a portion of the main body then using the method for spacer formation to deposit a layer of D-pl on top of the exposed side-surfaces of the main body. The occupied area by the landing pad main body is not increased and the trend of reducing the size of semiconductor in its entirety is still followed. Landing pad area expansion and solving all the puzzles caused by alignment accuracy shift can both be achieved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
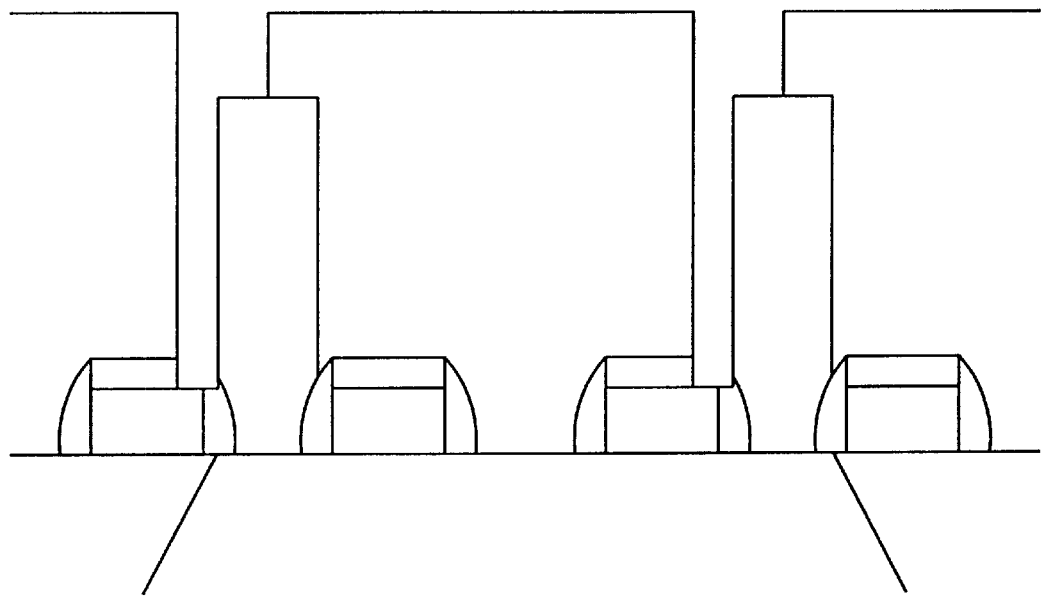
FIG. 1 shows a schematic diagram of a bad result caused by the traditional landing pad due to alignment accuracy shift.
Figure 2:
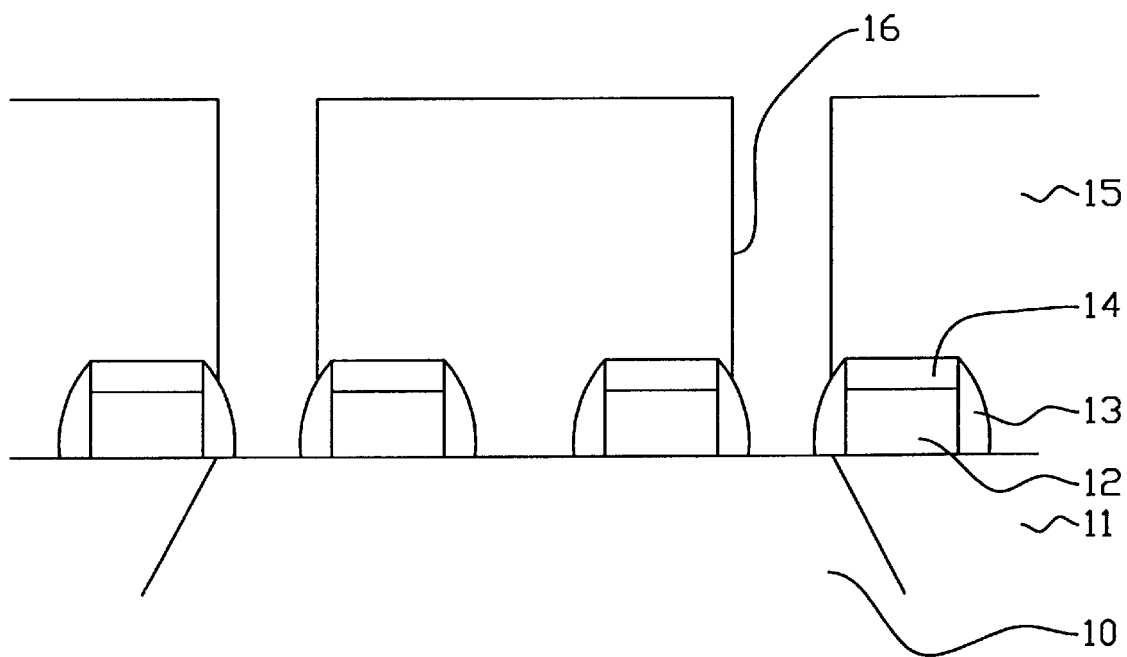
FIG. 2 shows a schematic diagram of a fundamental structure.

In one embodiment of the present invention, a method for increasing landing pad area is disclosed. The very first step would be for forming the structure shown in FIG. 2 by using the traditional way. Parts of the substrate 10 are shallow trench isolation regions 11. There are quite a few gates 12 on top of the substrate 10. These gates 12 are used as the word lines for dynamic random access memory (DRAM). A layer of silicon dioxide 14 is deposited on top of the gate 12 and spacer 13 and is attached to the gate sidewall. Both are used as isolation layer. A layer of interpoly dielectric (IPD) 15 is also deposited on top of the substrate 10 and the gate's 12 isolation layers. Wherein landing pad holes 16 are also formed within IPD 15 and located in between the neighboring gates 12, linking the top surface of IPD 15 and the top surface of the substrate 10.

Figure 3:
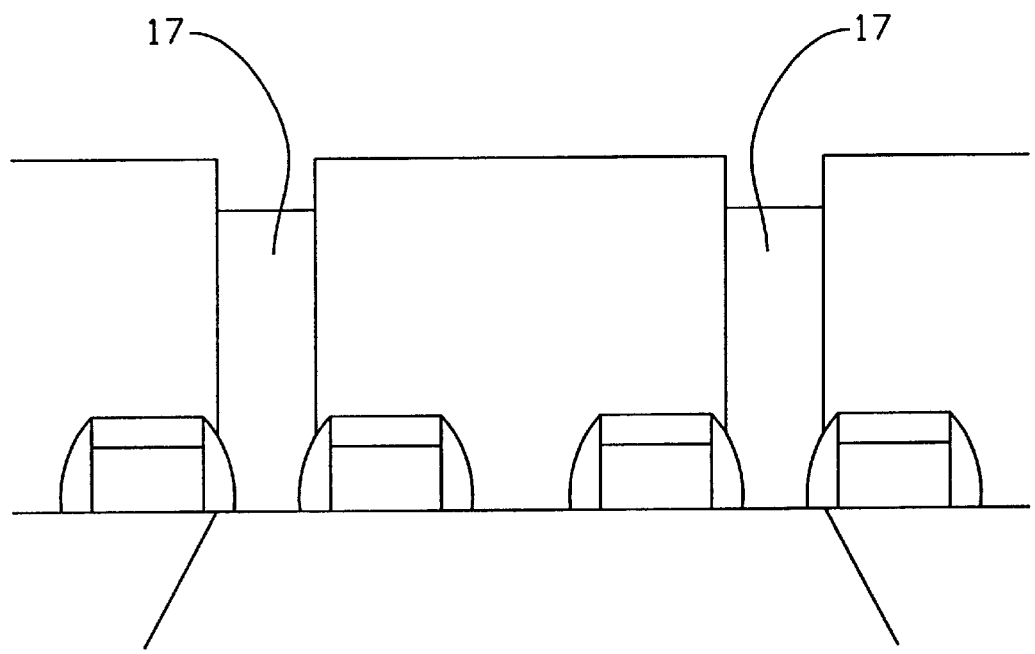
FIG 3. shows a schematic diagram of a layer of etched back D-pl deposition top of the surface.

Referring to FIG. 3, a layer of doped-polysilicon (D-pl) 17 is deposited inside the landing pad hole 16 and is then etched back. In the semiconductor industry, interpoly-silicon is always mixed with some dopant in order to increase its conductivity.

Figure 4:
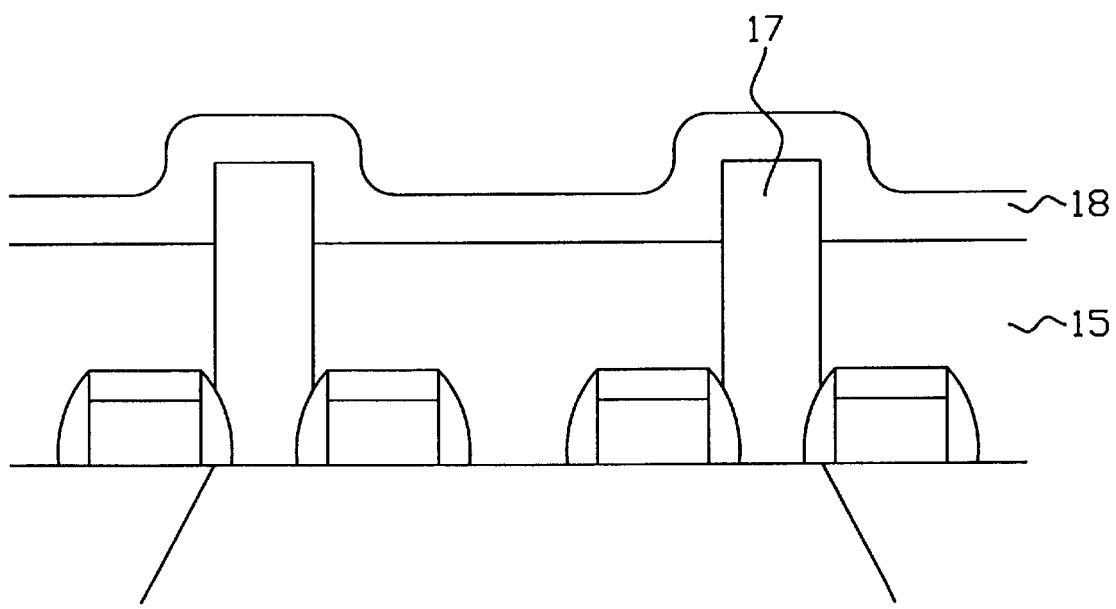
FIG. 4 shows a schematic diagram of etched back IPD surface exposed a portion of D-pl then deposited another layer of D-pl.

FIG. 4 illustrates the use of etching to etch back the top surface of IPD 15 and make its height lower than the height of D-pl 17 in order to expose the topmost and a portion of sidewall surfaces of D-pl 17.

Figure 5:
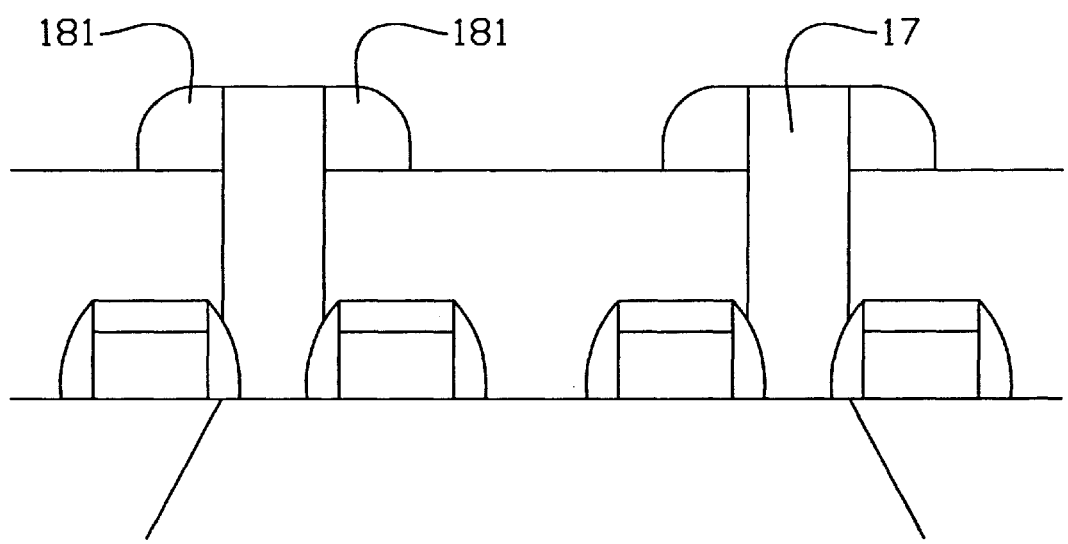
FIG. 5 shows a schematic diagram after the etching back of the second D-pl layer shown in FIG. 4.

Using the method of deposition to deposit a layer of D-pl 18 on top of all the surfaces is shown in FIG. 4. Etching back D-pl 18 to give a new landing pad structure with spacers 181 is shown in FIG. 5. The landing pad formed from the combination of the main body 17 and the spacers 181 is the landing pad that has been described in the present invention. The material used for the spacer 181 is the same as the landing pad's main body 17 in this particular case. However, different material can also be used as long as it will not get etched through during the etching of contact hole in the post-process. The landing pad formed from the above description would not increase the size of the semiconductor device and furthermore landing pad area expansion and solving all of the puzzles caused by alignment accuracy shift can both be achieved.

Although specific embodiments have been illustrated and described, it will be obvious to those skilled in the art that various modifications may be made without departing from what is intended to be limited solely by the appended claims.

What is claimed is:

1. A method for forming a landing pad, said method comprising:

providing a substrate, there are at least two gates with isolation layers on top of said substrate, said substrate is also covered with a dielectric layer, wherein there is a contact hole between two adjacent gates, said contact hole penetrates said dielectric layer from the top of said dielectric layer to top surface of said substrate;

forming a conductor within said contact hole;

etching back said dielectric layer and making its top surface lower than the top surface of said conductor, moreover exposing the top surface and a portion of sidewalls of said conductor; and forming a protection layer on top of the exposed portion of sidewalls of said conductor.

2. The method according to claim 1, wherein said isolation layer comprises one of the following: silicon dioxide, silicon nitride.

3. The method according to claim 1, wherein said dielectric layer comprises silicon dioxide.

4. The method according to claim 1, wherein said dielectric layer can at least be formed by deposition.

5. The method according to claim 1, wherein said conductor comprises doped-polysilicon.

6. The method according to claim 1, wherein said protection layer comprises one of the following: doped-polysilicon, silicon nitride.

7. A method for forming a landing pad, said method comprising:

providing a substrate, on top of said substrate comprising at least:

there are at least two gates with top and sidewall surface, moreover said gate has isolation layer on top of it and said sidewall has spacer, an interpoly dielectric layer is located on top of said isolation layer, said spacer and said substrate, there is a contact hole between two adjacent gates, said contact hole penetrates said interpoly dielectric layer from the top of said interpoly dielectric layer to said substrate;

forming a first doped-polysilicon within said contact hole;

etching back said interpoly dielectric layer and making its top surface lower than the top surface of said first doped-polysilicon, moreover exposing the top surface and a portion of sidewalls of said first doped-polysilicon; and forming a second doped-polysilicon or silicon nitride on top of the exposed portion of side wails of said first doped-polysilicon.

8. The method according to claim 7, wherein said isolation layer comprises one of the following: silicon dioxide, silicon nitride.

9. The method according to claim 7, wherein said spacer comprises silicon nitride.

10. The method according to claim 7, wherein said interpoly dielectric layer can at least be formed by deposition.

* * * * *